(12) United States Patent
Hsu et al.

(10) Patent No.: US 10,276,526 B2
(45) Date of Patent: Apr. 30, 2019

(54) SEMICONDUCTOR PACKAGE STRUCTURE AND MANUFACTURING METHOD THEREOF

(71) Applicant: Powertech Technology Inc., Hsinchu County (TW)

(72) Inventors: Hung-Hsin Hsu, Hsinchu County (TW); Nan-Chun Lin, Hsinchu County (TW); Shang-Yu Chang Chien, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/162,389

(22) Filed: Oct. 17, 2018

(65) Prior Publication Data

US 2019/0051625 A1    Feb. 14, 2019

Related U.S. Application Data

(62) Division of application No. 15/599,481, filed on May 19, 2017, now Pat. No. 10,141,276.

(Continued)

(51) Int. Cl.
*H01L 23/00* (2006.01)
*H01L 23/31* (2006.01)
(Continued)

(52) U.S. Cl.
CPC ............. *H01L 24/09* (2013.01); *H01L 21/50* (2013.01); *H01L 21/56* (2013.01); *H01L 21/561* (2013.01);
(Continued)

(58) Field of Classification Search
CPC ....... H01L 2924/81; H01L 2224/12105; H01L 23/5389; H01L 2224/96; H01L 21/56; H01L 23/3135; H01L 2924/18161
(Continued)

(56) References Cited

U.S. PATENT DOCUMENTS 9,484,292 B2 * 11/2016 Hwang ................ H01L 23/481
2015/0200166 A1 * 7/2015 Kono ..................... H01L 24/03
257/529

(Continued)

*Primary Examiner* — S. V. Clark
(74) *Attorney, Agent, or Firm* — JCIPRNET

(57) ABSTRACT

A semiconductor package structure and a manufacturing method thereof are provided. The semiconductor package structure includes a redistribution structure, at least one package structure and a second encapsulant. The redistribution structure has a first surface and a second surface opposite to the first surface. The package structure is over the first surface and includes at least one die, a first encapsulant, a redistribution layer, and a plurality of second conductive terminals. The die has a plurality of first conductive terminals thereon. The first encapsulant encapsulates the die and exposes at least part of the first conductive terminals. The redistribution layer is over the first encapsulant and is electrically connected to the first conductive terminals. The second conductive terminals are electrically connected between the redistribution layer and the redistribution structure. The second encapsulant, encapsulates the package structure and exposes at least part of the second conductive terminals.

11 Claims, 18 Drawing Sheets

Related U.S. Application Data

(60) Provisional application No. 62/385,259, filed on Sep. 9, 2016.

(51) Int. Cl.
*H01L 21/50* (2006.01)
*H01L 25/00* (2006.01)
*H01L 25/10* (2006.01)
*H01L 21/683* (2006.01)
*H01L 21/56* (2006.01)

(52) U.S. Cl.
CPC ........ *H01L 21/568* (2013.01); *H01L 21/6835* (2013.01); *H01L 23/3128* (2013.01); *H01L 23/3135* (2013.01); *H01L 24/11* (2013.01); *H01L 24/14* (2013.01); *H01L 24/17* (2013.01); *H01L 25/10* (2013.01); *H01L 25/50* (2013.01); *H01L 24/19* (2013.01); *H01L 24/20* (2013.01); *H01L 24/81* (2013.01); *H01L 2221/68345* (2013.01); *H01L 2221/68359* (2013.01); *H01L 2221/68381* (2013.01); *H01L 2224/02331* (2013.01); *H01L 2224/02335* (2013.01); *H01L 2224/02379* (2013.01); *H01L 2224/0346* (2013.01); *H01L 2224/0401* (2013.01); *H01L 2224/04105* (2013.01); *H01L 2224/05567* (2013.01); *H01L 2224/05624* (2013.01); *H01L 2224/05639* (2013.01); *H01L 2224/05644* (2013.01); *H01L 2224/05647* (2013.01); *H01L 2224/12105* (2013.01); *H01L 2224/131* (2013.01); *H01L 2224/96* (2013.01); *H01L 2924/12* (2013.01); *H01L 2924/3511* (2013.01)

(58) Field of Classification Search
USPC .................. 438/106, 177, 108, 110, 126, 127
See application file for complete search history.

(56) References Cited

U.S. PATENT DOCUMENTS

2015/0294962 A1* 10/2015 Lin .......................... H01L 25/50
                                                                438/108
2016/0141227 A1*  5/2016 Lin ..................... H01L 25/0657
                                                                257/774
2018/0026023 A1*  1/2018 Lin ................... H01L 21/76877
                                                                438/109

* cited by examiner

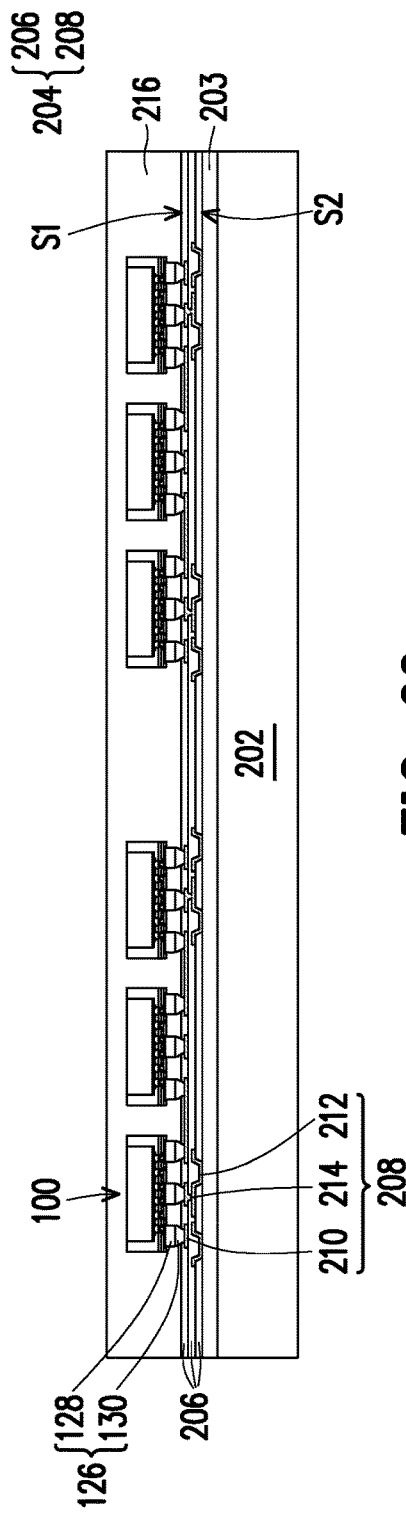
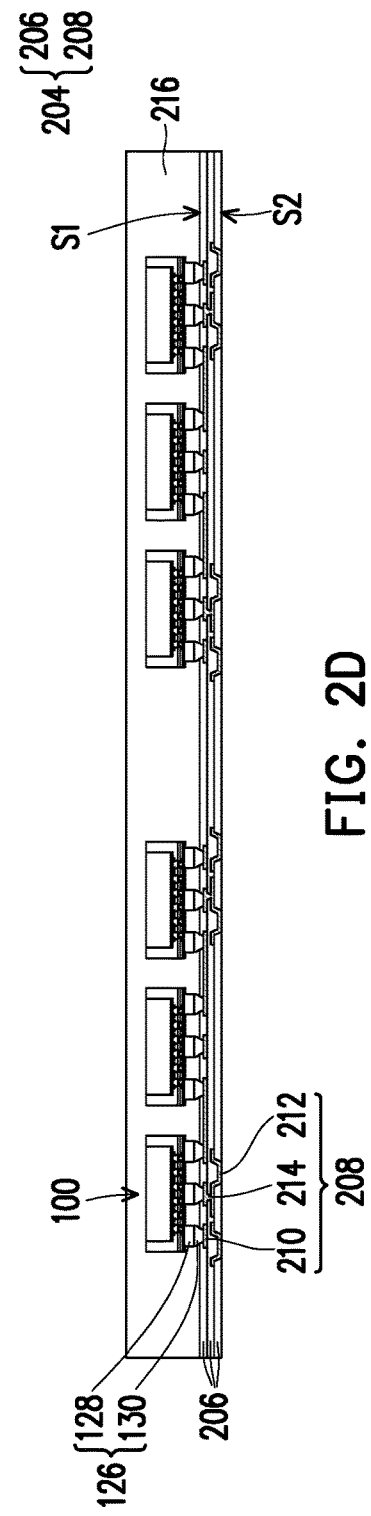
FIG. 2C
FIG. 2D

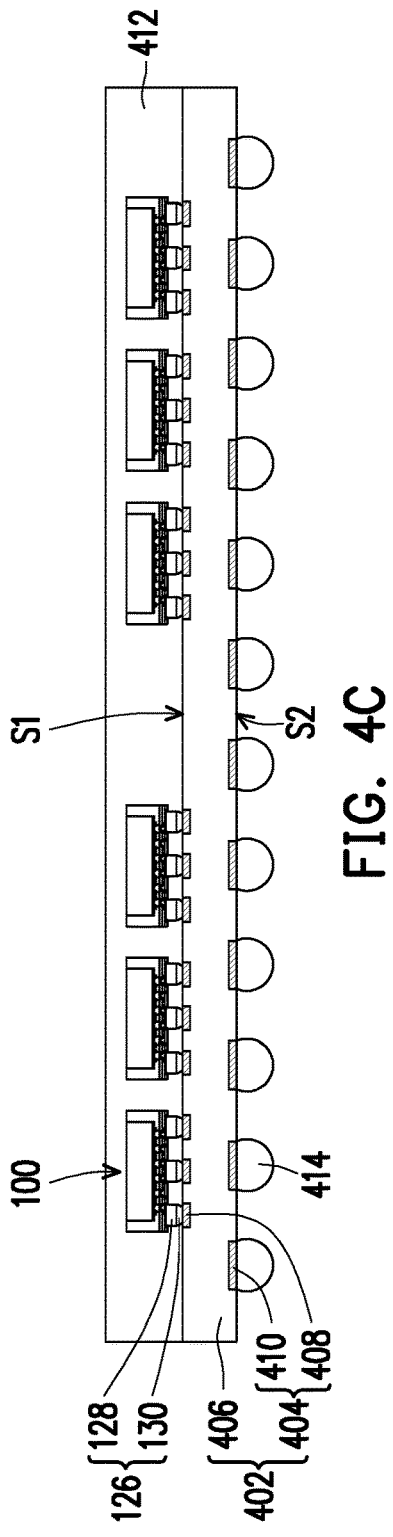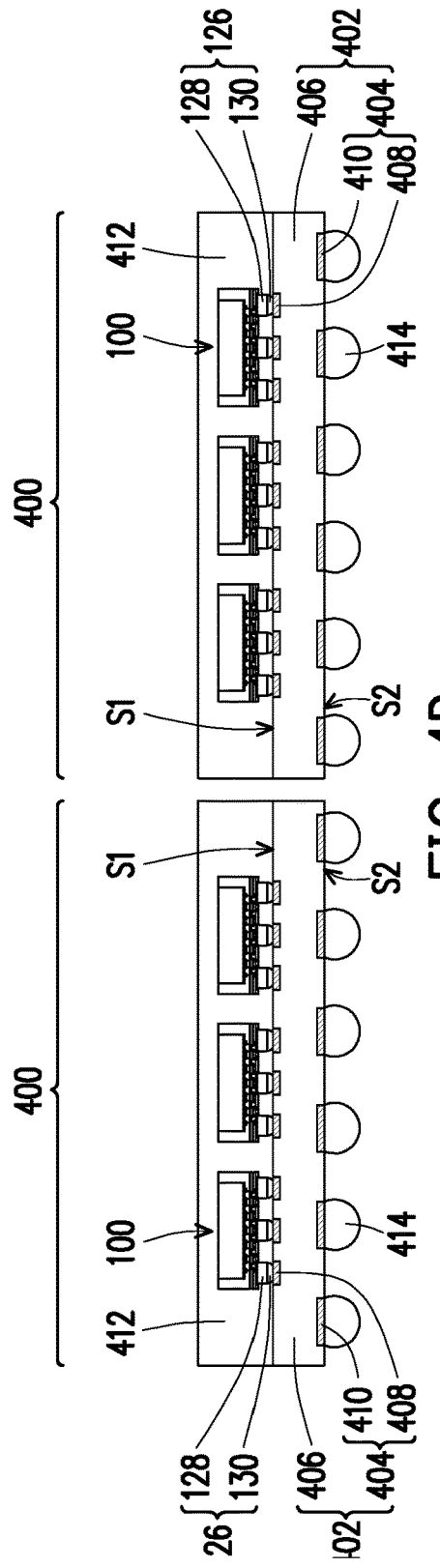
FIG. 4C
FIG. 4D

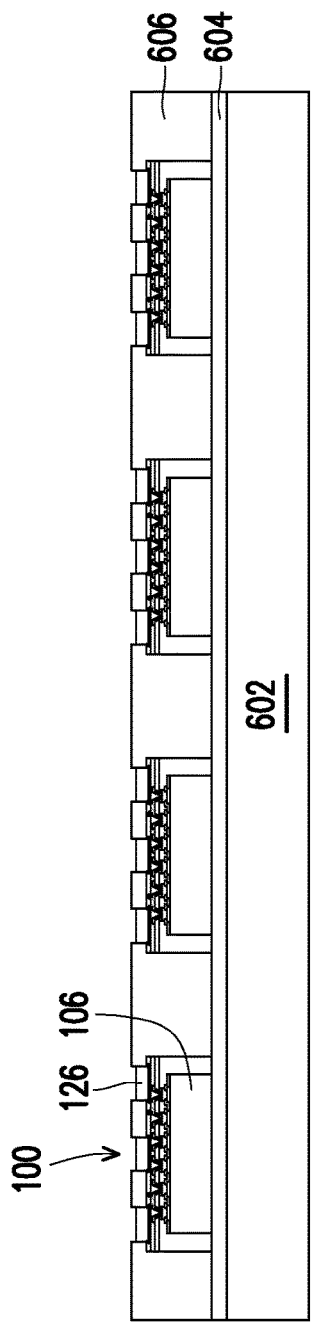
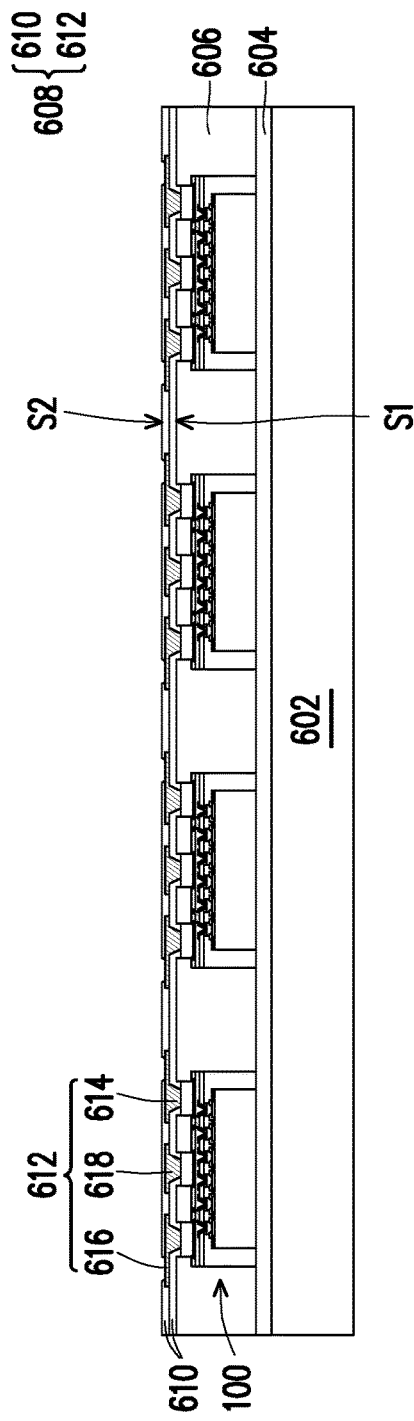
FIG. 6C
FIG. 6D

SEMICONDUCTOR PACKAGE STRUCTURE AND MANUFACTURING METHOD THEREOF

CROSS REFERENCE TO RELATED APPLICATION

This application is a divisional application of U.S. application Ser. No. 15/599,481, filed on May 19, 2017, now allowed, which claims the priority benefit of U.S. provisional application Ser. No. 62/385,259, filed on Sep. 9, 2016. The entirety of each of the above-mentioned patent applications is hereby incorporated by reference herein and made a part of specification.

BACKGROUND OF THE INVENTION

1. Field of the Invention

The present invention generally relates to a semiconductor package structure, in particular, to a fan-out semiconductor package structure.

2. Description of Related Art

Semiconductor package technology has been progressed in recent years in order to develop products with smaller volume, lighter weight, higher integration level and lower manufacturing cost. As an example, a wafer level fan-in package of which input/output (I/O) terminals for transmitting electric signals within a section of the respective die connected thereto is developed. However, since I/O connections are limited to the surface of the die, this package type is limited to low-end devices requiring up to 200 to 300 I/O connection numbers.

SUMMARY OF THE INVENTION

Accordingly, the present invention provides a semiconductor package structure and a manufacturing method thereof, which is compatible with higher I/O connection numbers and is able to effectively reduce the manufacturing cost thereof.

The present invention provides a semiconductor package structure including a redistribution structure, at least one package structure, and a second encapsulant. The redistribution structure has a first surface and a second surface opposite to the first surface. The at least one package structure is over the first surface of the redistribution structure. The at least one package structure includes at least one die, a first encapsulant, a redistribution layer, and a plurality of second conductive terminals. The at least one die has a plurality of first conductive terminals thereon. The first encapsulant encapsulates the at least one die and exposes at least part of the first conductive terminals. The redistribution layer is over the first encapsulant and is electrically connected to the first conductive terminals. The second conductive terminals are electrically connected between the redistribution layer and the redistribution structure. The second encapsulant encapsulates the at least one package structure and exposes at least part of the second conductive terminals.

The present invention provides a manufacturing method of a semiconductor package structure. The method at least includes the following steps. At least one package structure is formed. The at least one package structure includes at least one die having a plurality of first conductive terminals thereon, a first encapsulant encapsulating the at least one die and exposing at least part of the first conductive terminals, a redistribution layer over the first encapsulant and electrically connected to the first conductive terminals, and a plurality of second conductive terminals over the redistribution layer. The at least one package structure is coupled to a first surface of a redistribution structure. The second conductive terminals of the at least one package structure are electrically connected to the redistribution structure. The at least one package structure is encapsulated by a second encapsulant.

In light of the foregoing, the first encapsulant of the package structure provides additional area around each die such that the first conductive terminals on the die may be routed to the additional area via the redistribution layer. Based on the fan-out configuration of the package structure, the package structure is compatible with higher I/O connection numbers. In addition, improved electrical and thermal performance of the package structure may be attained. Similarly, as a result of embedding the package structure in the second encapsulant and coupling the redistribution structure with the second conductive terminals of the package structure, the semiconductor package structure forms another fan-out package structure. Therefore, even higher numbers of I/O connection may be achieved. In addition, a conventionally known through silicon via (TSV) interposer may be replaced by the redistribution structure to reduce the manufacturing cost. Furthermore, the redistribution layer and the redistribution structure are formed separately during different fan-out processes. Therefore, a warpage level of the package structures may be lowered. As a result, the semiconductor package structure may incorporate redistribution structure with a more complicated design.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2F are schematic cross-sectional views illustrating a manufacturing method of semiconductor package structures according to an embodiment of the present invention.

FIG. 4A to FIG. 4D are schematic cross-sectional views illustrating a manufacturing method of semiconductor package structures according to another embodiment of the present invention.

FIG. 6A to FIG. 6F are schematic cross-sectional views illustrating a manufacturing method of semiconductor package structures according to yet another embodiment of the present invention.

DESCRIPTION OF THE EMBODIMENTS

Figure 1A:
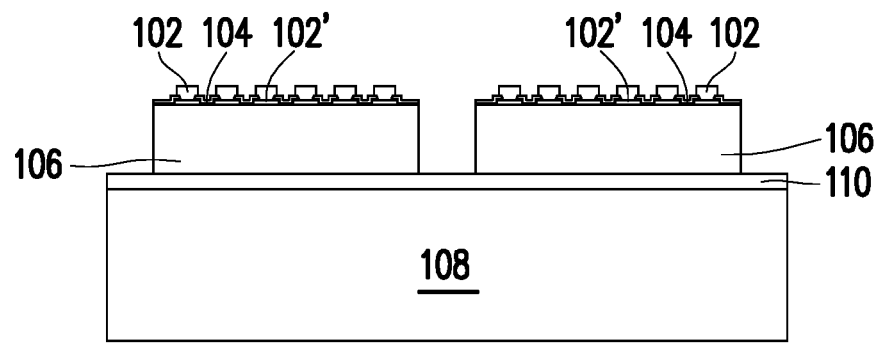
FIG. 1A to FIG. 1G are schematic cross-sectional views illustrating a manufacturing method of package structures according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1G are schematic cross-sectional views illustrating a manufacturing method of package structures 100 according to an embodiment of the present invention.

Referring to FIG. 1A, a plurality of dies 106 are formed over a carrier 108. The carrier 108 may be made of glass, plastic, or other suitable materials. Each of the dies 106 has a plurality of first conductive terminals 102 formed thereon. The dies 106 may be manufactured by the following steps. First, a wafer (not illustrated) having a plurality of pads 102' formed thereon is provided. Subsequently, a passivation layer (not illustrated) is formed to cover the pads and the wafer. The passivation layer is patterned to render a plurality of passivation patterns 104. The passivation layer may be patterned through a photolithography and an etching process, for example. The passivation patterns 104 exposes at least part of the pads 102'. Thereafter, the first conductive terminals 102 are formed over the pads 102'. The first conductive terminals 102 may be formed through a plating process. The plating process is, for example, electro-plating, electroless-plating, immersion plating, or the like. Afterward, the wafer is grinded from a rear surface opposite to the first conductive terminals 102 and is diced to obtain a plurality of dies 106. It should be noted that a surface of each die 106 having the first conductive terminals 102 formed thereon is considered as an active surface of the die 106.

In some embodiments, an adhesive layer 110 may be disposed between the carrier 108 and the dies 106 to temporarily enhance the adhesion between the dies 106 and the carrier 108. The adhesive layer 110 may be a LTHC (light to heat conversion) adhesive layer or other suitable adhesive layers. It should be noted that two dies 106 are formed over the carrier 108 in FIG. 1A, but the present invention is not limited thereto. In some alternative embodiments, one single die 106 or more than two dies 106 may be placed on the carrier 108.

Figure 1B:
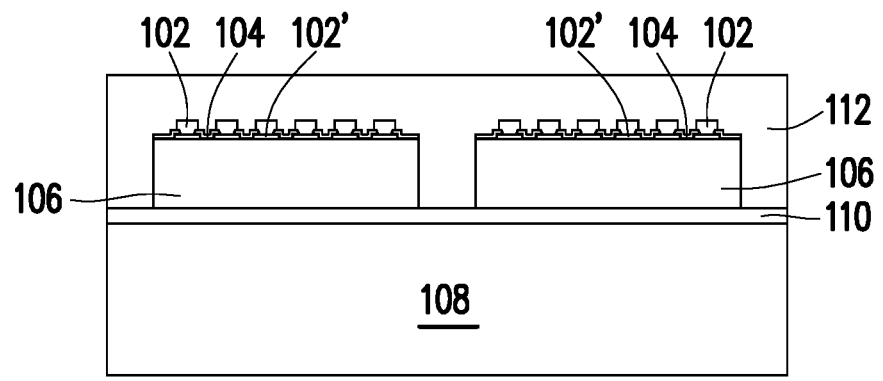

Referring to FIG. 1B, a first encapsulant 112 is formed on the carrier 108 to encapsulate the dies 106. In some embodiment, the first encapsulant 112 may include molding compounds formed by a molding process. In some alternative embodiments, the first encapsulant 112 may be formed by an insulating material such as epoxy or other suitable resins.

Figure 1C:
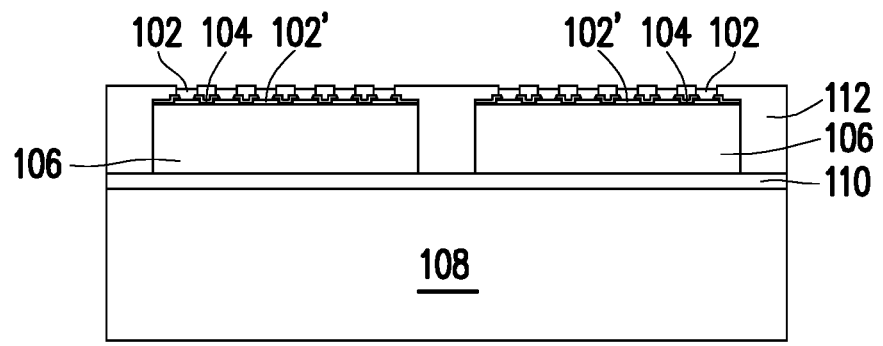

Referring to FIG. 1C, the first encapsulant 112 is thinned until top surfaces of the first conductive terminals 102 are exposed. As illustrated in FIG. 1C, the first encapsulant 112 exposes part of the first conductive terminals 102. In some embodiments, after the first encapsulant 112 is thinned to expose top surfaces of the first conductive terminals 102, an etching process may be further performed on the first conductive terminals 102. For example, the first conductive terminals 102 may be partially removed such that top surfaces of the first conductive terminals 102 are slightly lower than a top surface of the first encapsulant 112. In some embodiments, the top surfaces of the first conductive terminals 102 are 1 μm to 3 μm lower than the top surface of the first encapsulant 112. As a result, a surface roughness of the first encapsulant 112 and the first conductive terminals 102 may be enhanced, so as to increase an adhesive property with layers subsequently formed thereon. The thinning process may be achieved by, for example, mechanical grinding, Chemical-Mechanical Polishing (CMP), etching, or other suitable methods. The etching process for the first conductive terminals 102 may include anisotropic etching or isotropic etching.

Figure 1D:
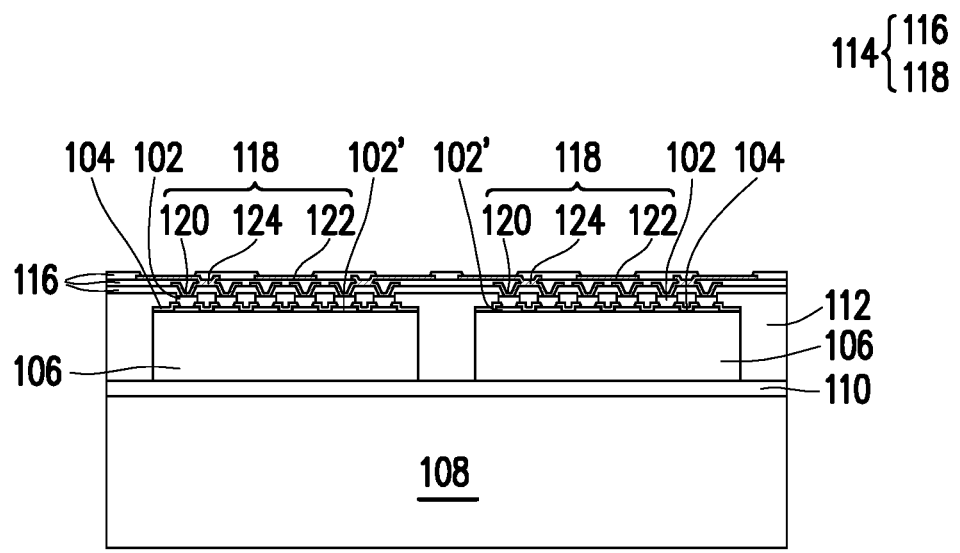

Referring to FIG. 1D, a redistribution layer 114 is formed over the first encapsulant 112 and is electrically connected to the first conductive terminals 102. The redistribution layer 114 may include at least one dielectric layer 116 and a plurality of conductive elements 118 embedded in the dielectric layer 116. As illustrated in FIG. 1D, the redistribution layer 114 includes three dielectric layers 116. However, the number of the dielectric layer 116 is not limited and may be adjusted based on circuit design. The conductive elements 118 may include a plurality of bonding pads 120, a plurality of bonding pads 122, and a plurality of interconnect structures 124. The bonding pads 120 are disposed facing the first conductive terminals 102. The bottommost dielectric layer 116 exposes the bonding pads 120 for electrical connection with other elements. For example, the bonding pads 120 may be directly in contact with the first conductive terminals 102 to render electrical connection between the dies 106 and the redistribution layer 114. The bonding pads 122 are disposed at a surface of the redistribution layer 114 opposite to the first conductive terminals 102. The topmost dielectric layer 116 exposes the bonding pads 122 for electrical connection with elements formed in the subsequent processes. The interconnect structures 124 are embedded in the dielectric layers 116 and are electrically connected between at least part of the bonding pads 120 and at least part of the bonding pads 122. The conductive elements 118 may be formed by a plating process and may include copper, aluminium, gold, silver, solder, or a combination thereof.

Figure 1E:
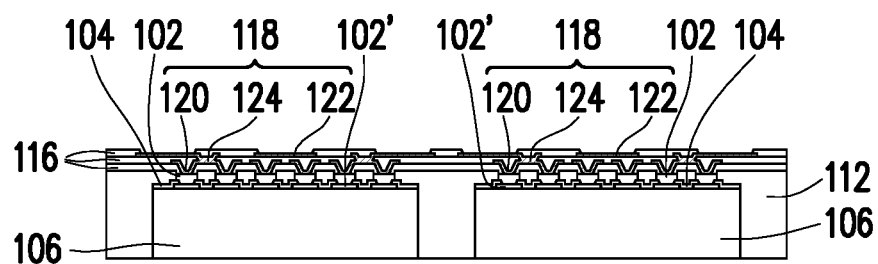

Referring to FIG. 1E, the carrier 108 is separated from the dies 106 and the first encapsulant 112 by a debonding process. In detail, thermal energy or optical energy (such as heating or UV irradiation) may be applied to the adhesive layer 110. Upon stimulation, the adhesive layer 110 loses adhesive property and may be readily peeled off from the carrier 108, the dies 106, and the first encapsulant 112.

Figure 1F:
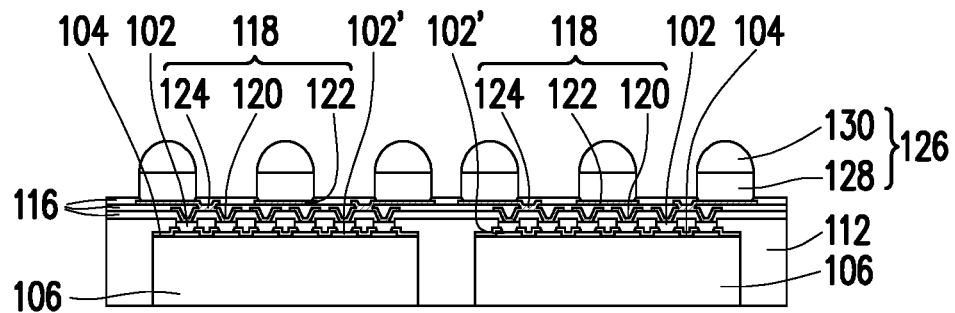

Referring to FIG. 1F, a plurality of second conductive terminals 126 are disposed on the bonding pads 122 and are electrically connected to the bonding pads 122. The second conductive terminals 126 may include conductive pillar, conductive bump, or a combination thereof. For example, as illustrated in FIG. 1F, each of the second conductive terminals 126 includes a conductive pillar 128 and a conductive bump 130 disposed over the conductive pillar 128.

Figure 1G:
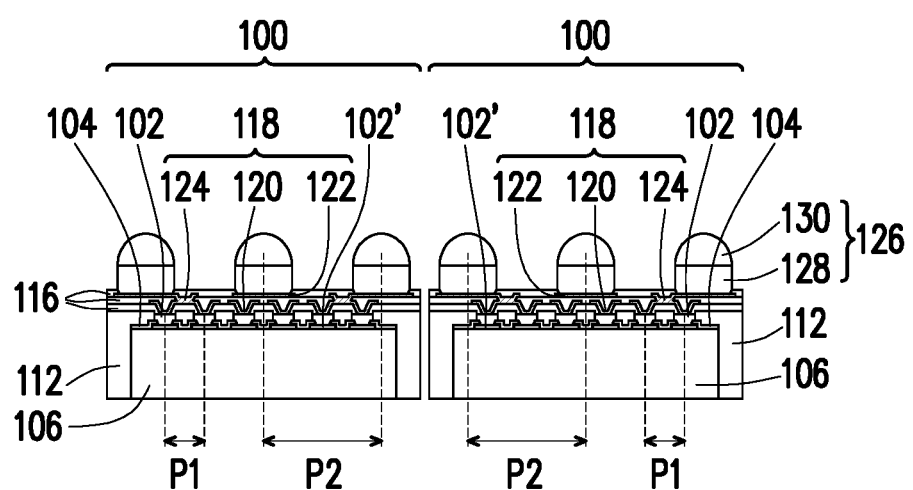

Referring to FIG. 1G, a singulation process is performed. The first encapsulant 112 is sawed between adjacent dies 106 to obtain a plurality of package structures 100. The singulation process includes, for example, cutting with rotating blade or laser beam.

As a result of embedding the dies 106 in the first encapsulant 112 and disposing the redistribution layer 114 over the first encapsulant 112, a first pitch P1 between two adjacent first conductive terminals 102 is smaller than a second pitch P2 between two adjacent second conductive terminals 126. In other words, each of the package structures 100 forms a fan-out package structure, in which the first encapsulant 112 provides additional area around each die 106 such that the first conductive terminals 102 may be routed to the additional area via the redistribution layer 114. Therefore, higher I/O connection numbers may be achieved in the package structure 100. In addition, an improved electrical and a thermal performance of the package structures 100 may also be attained.

FIG. 2A to FIG. 2F are schematic cross-sectional views illustrating a manufacturing method of semiconductor package structures 200 according to an embodiment of the present invention.

Figure 2A:
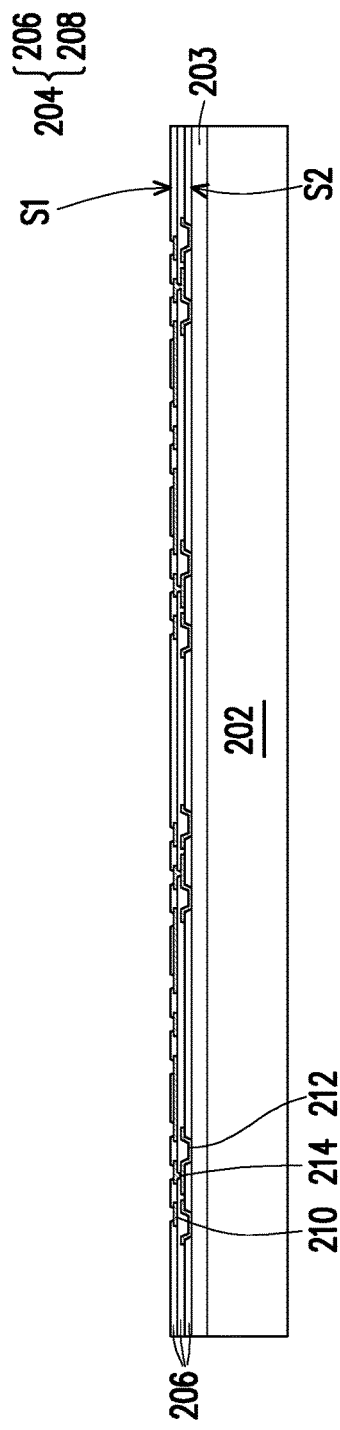

Referring to FIG. 2A, a redistribution structure 204 is formed on a carrier 202. The carrier 202 may be made of glass, plastic, or other suitable materials. In some embodiments, an adhesive layer 203 may be pre-disposed on the carrier 202, so as to temporarily improve the adhesion between the redistribution structure 204 and the carrier 202. The adhesive layer 203 may be a LTHC (light to heat conversion) adhesive layer or other suitable adhesive layers. The redistribution structure 204 may include at least one dielectric layer 206 and a plurality of conductive elements 208 embedded in the dielectric layer 206. The conductive elements 208 include a plurality of first boding pads 210, a plurality of second bonding pads 212, and a plurality of interconnect structures 214. The first bonding pads 210 are disposed at a first surface S1 of the redistribution structure 204 opposite to the carrier 202. The topmost dielectric layer 206 exposes the first bonding pads 210. The second bonding pads 212 are disposed at a second surface S2 of the redistribution structure 204 facing the carrier 202. The bottommost dielectric layer 206 exposes the second bonding pads 212. The interconnect structures 214 are embedded in the dielectric layers 206 and are electrically connected between at least part of the first bonding pads 210 and at least part of the second bonding pads 212.

Figure 2B:
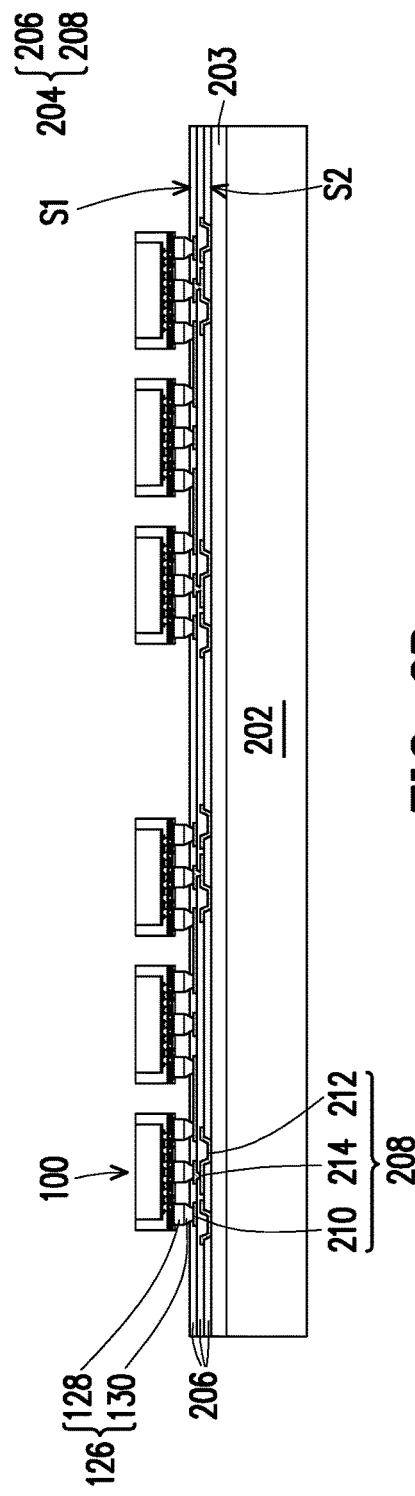

Referring to FIG. 2B, the package structures 100 shown in FIG. 1G are coupled to or placed on the first surface S1 of the redistribution structure 204 through flip-chip bonding. The second conductive terminals 126 of the package structures 100 are electrically connected to the first bonding pads 210 of the redistribution structure 204. In other words, the second conductive terminals 126 are electrically connected between the redistribution layer 114 and the redistribution structure 204. It should be noted that six package structures 100 are formed over the carrier 202 in FIG. 2B, but the present invention is not limited thereto. In some alternative embodiments, one single package structure 100 or more than six package structures 100 may be placed on the carrier 202.

Referring to FIG. 2C, a second encapsulant 216 is formed on the first surface S1 of the redistribution structure 204 to encapsulate the package structures 100. In some embodiments, the second encapsulant 216 may include molding compounds formed by a molding process. In some alternative embodiments, the second encapsulant 216 may be formed by an insulating material such as epoxy or other suitable resins. Moreover, in some alternative embodiments, a top surface of the second encapsulant 216 may be thinned to reduce the overall thickness of the resulting semiconductor package structure 200. The thinning process may be achieved by, for example, mechanical grinding, Chemical-Mechanical Polishing (CMP), etching, or other suitable methods. In some alternative embodiments, since the active surface of each die 106 faces downward, the dies 106 may also be thinned to desired thicknesses without affecting the electrical properties thereof. In the present embodiment, the step of coupling the redistribution structure 204 with the package structures 100 precedes the step of encapsulating the package structures 100 by the second encapsulant 216.

Referring to FIG. 2D, the carrier 202 and the adhesive layer 203 are removed or de-bonded from the redistribution structure 204. For example, thermal energy or optical energy (such as heating or UV irradiation) may be applied to the adhesive layer 203. Upon stimulation, the adhesive layer 203 loses adhesive property and may be readily peeled off from the carrier 202 and the redistribution structure 204.

Figure 2E:
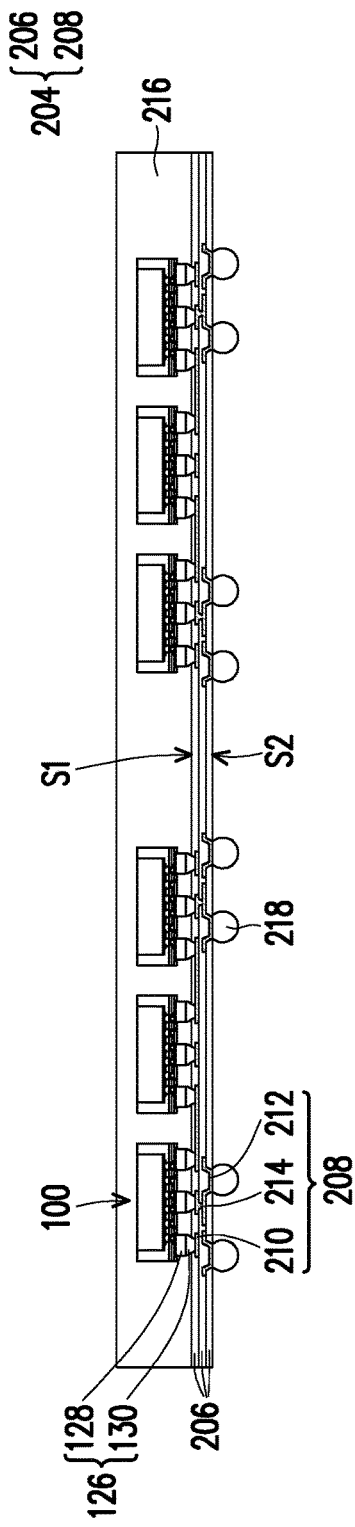

Referring to FIG. 2E, a plurality of solder balls 218 are formed over the second surface S2 of the redistribution structure 204. The solder balls 218 are electrically connected to the second bonding pads 212 of the redistribution structure 204. The solder balls 218 may be formed by, for example, a ball placement process.

Figure 2F:
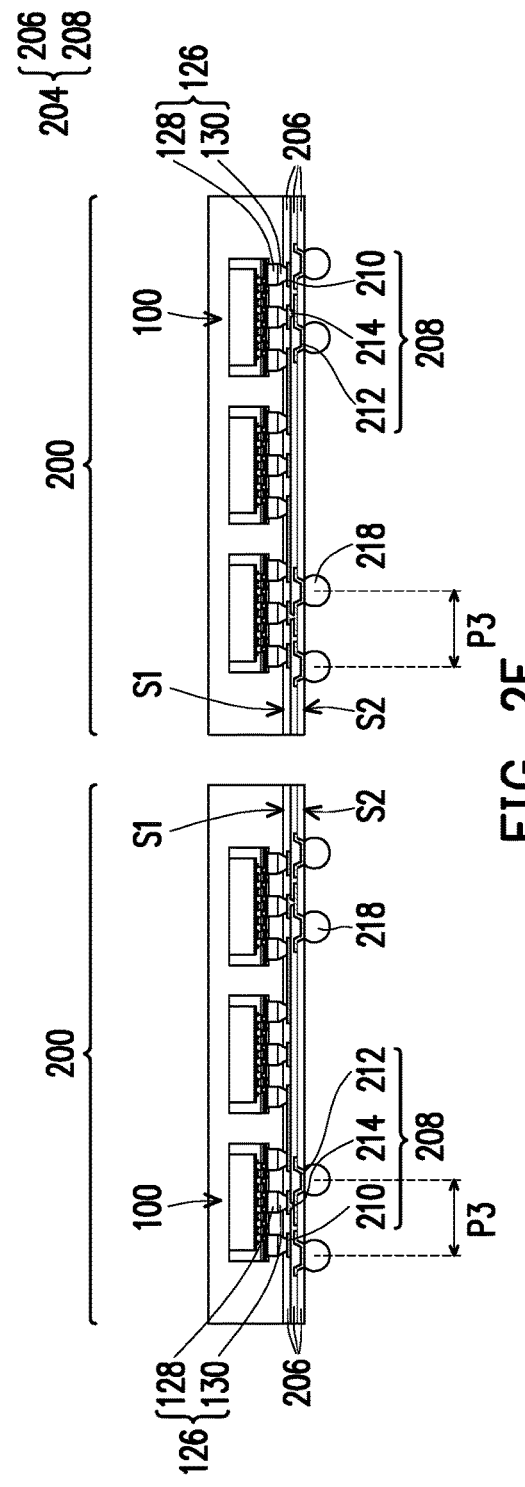

Referring to FIG. 2F, a singulation process is performed. The second encapsulant 216 is sawed between adjacent package structures 100, so as to form a plurality of semiconductor package structures 200. The singulation process includes, for example, cutting with rotating blade or laser beam.

Referring to both of FIG. 1G and FIG. 2F, as a result of embedding the package structures 100 in the second encapsulant 216 and disposing the redistribution structure 204 over the second encapsulant 216, the second pitch P2 is smaller than a third pitch P3 between two adjacent solder balls 218. In other words, each of the semiconductor package structures 200 forms a fan-out package structure having a fan-out package structure (package structure 100) embedded therein. The second encapsulant 216 of the semiconductor package structures 200 further provides extra area around each of the package structures 100 for trace routing. Therefore, even higher numbers of I/O connections may be achieved. In addition, a conventionally known through silicon via (TSV) interposer may be replaced by the redistribution structure 204 to reduce the manufacturing cost. Furthermore, the redistribution layer 114 is formed on the dies 106 in the package structures 100. On the other hand, the redistribution structure 204 is formed on the carrier 202. In other words, the redistribution layer 114 and the redistribution structure 204 are formed separately during different fan-out processes. Therefore, a warpage level of the package structures 100 may be lowered. Thus, a warpage level of the semiconductor package structure 200 can be lower than a semiconductor package structure in which both of two redistribution structures are directly formed on dies/package structures (not separately formed). As a result, the semiconductor package structure 200 may incorporate redistribution structure 204 with a more complicated design.

The semiconductor package structures 200 may be compatible with high-end device applications and advanced front-end technology node, of which a number of I/O connections is higher, and a pad pitch of each die is narrower.

FIG. 3A to FIG. 3D are schematic cross-sectional views illustrating semiconductor package structures 300a, 300b, 300c, and 300d according to some embodiments of the present invention.

Figure 3A:
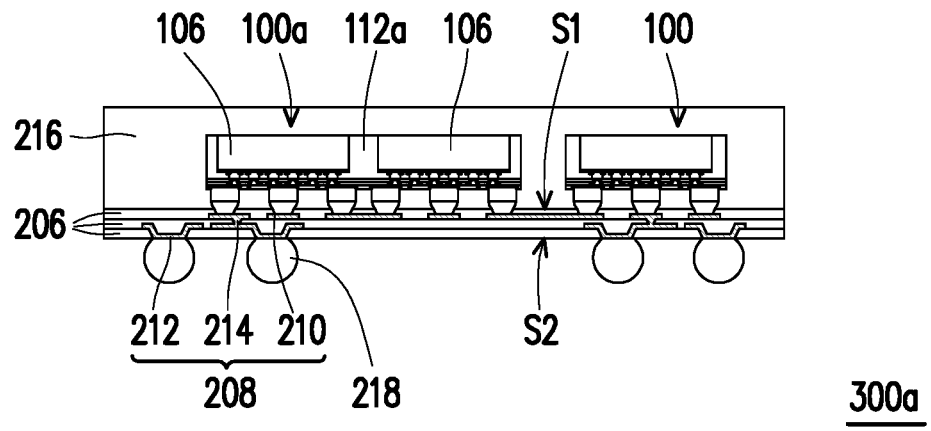
FIG. 3A to FIG. 3D are schematic cross-sectional views illustrating semiconductor package structures according to some embodiments of the present invention.

Referring to FIG. 3A, the semiconductor package structure 300a is similar to the semiconductor package structure 200 shown in FIG. 2F, so the detailed descriptions are omitted herein. The difference between the semiconductor package structure 300a and the semiconductor package structure 200 lies in that the semiconductor package structure 300a further includes a package structure 100a. The package structure 100a is similar to the package structure 100 illustrated in FIG. 1G, except that the package structure 100a includes two dies 106. In other words, multiple dies may be integrated in the package structure 100a.

Figure 3B:
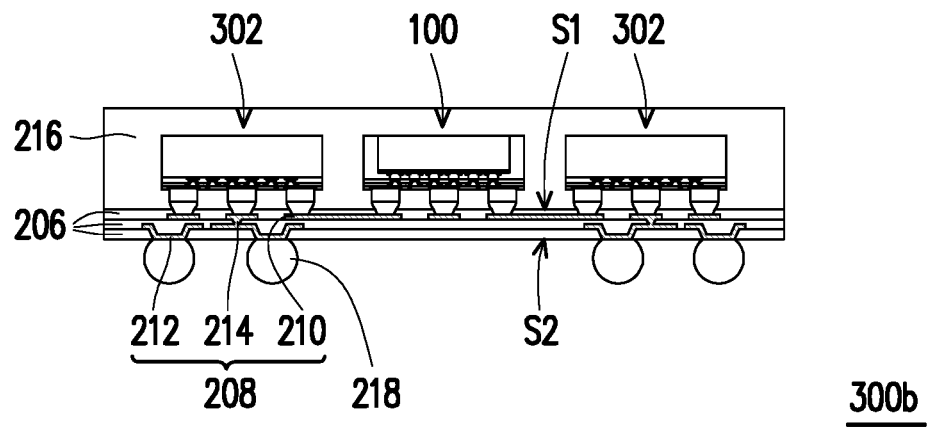

Referring to FIG. 3B, the semiconductor package structure 300b is similar to the semiconductor package structure 200 shown in FIG. 2F, so the detailed descriptions are omitted herein. The difference between the semiconductor package structure 300b and the semiconductor package structure 200 lies in that the semiconductor package structure 300b further includes at least one additional package structure 302. The additional package structures 302 are, for example, a wafer level chip scale package (WLCSP). In other words, the additional package structures 302 are fan-in package structures. As compared to the package structure 100 (fan-out package structure) illustrated in FIG. 1G, the die 106 in the additional package structure 302 is not encapsulated by an encapsulant. Similar to the package structures 100, the additional package structures 302 are also coupled to the first surface S1 of the redistribution structure 204 through flip-chip bonding. Subsequently, the steps illustrated FIG. 2C to FIG. 2F may be performed to obtain the semiconductor package structure 300b. As a result, package structures of different types can be readily integrated, so as to meet applications of multi-chip package (MCP) or system in package (SIP).

Figure 3C:
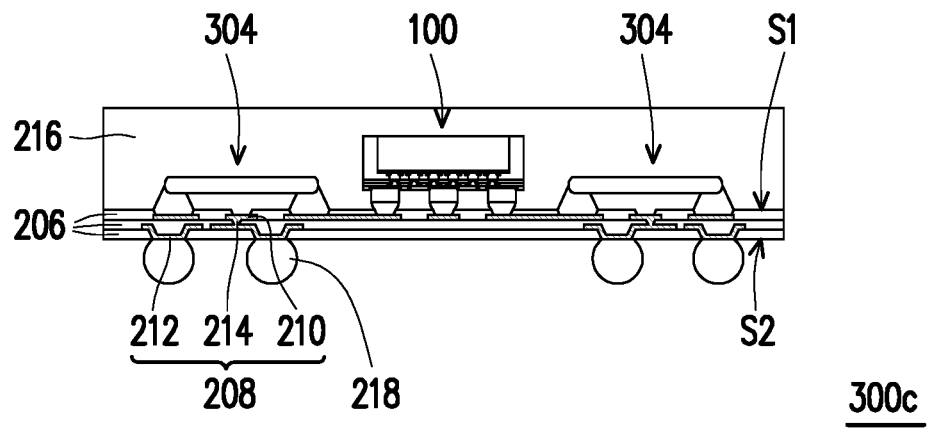

Referring to FIG. 3C, the semiconductor package structure 300c is similar to the semiconductor package structure 200 shown in FIG. 2F, so the detailed descriptions are omitted herein. The difference between the semiconductor package structure 300c and the semiconductor package structure 200 lies in that the semiconductor package structure 300c further includes at least one passive device 304. The passive devices 304 are, for example, resistors, capacitors, inductors, diodes, or antennas. Similar to the package structures 100, the passive devices 304 are also placed on the first surface S1 of the redistribution structure 204. Subsequently, the steps illustrated FIG. 2C to FIG. 2F may be performed to obtain the semiconductor package structure 300c. As a result, package structures and passive devices can be readily integrated.

Figure 3D:
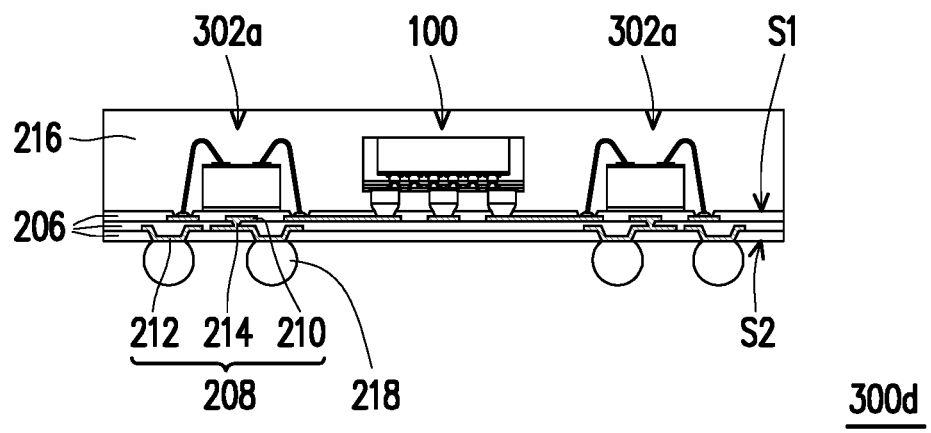

Referring to FIG. 3D, the semiconductor package structure 300d is similar to the semiconductor package structure 300b shown in FIG. 3B, so the detailed descriptions are omitted herein. The difference between the semiconductor package structure 300d and the semiconductor package structure 300b lies in that the additional package structures 302a of the semiconductor package structure 300d are coupled to the first surface S1 of the redistribution structure 204 through wire bonding. Accordingly, during the formation of the additional package structure 302a, the steps related to the first encapsulant 112, the redistribution layer 114, and the second conductive terminals 126 illustrated in FIG. 1A to FIG. 1G may be omitted. Based on the configuration of the semiconductor package structure 300d, package structures of different type can be readily integrated.

FIG. 4A to FIG. 4D are schematic cross-sectional views illustrating a manufacturing method of semiconductor package structures 400 according to another embodiment of the present invention.

Figure 4A:
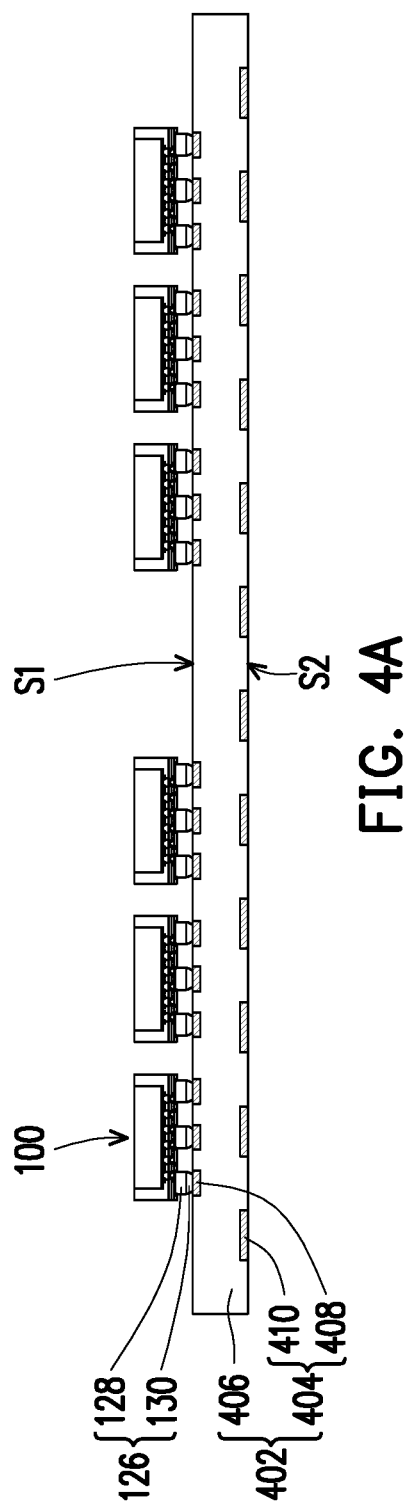

Referring to FIG. 4A, a redistribution structure 402 is provided. In some embodiments, the redistribution structure 402 may include a Printed Circuit Board (PCB) or an organic package substrate. For example, the organic package substrate may include conventionally available organic substrate for assembly, such as a core organic package substrate (BT substrate) or a core-less organic package substrate. For example, the redistribution structure 402 may be formed by fan-out base machine/process by outsourced semiconductor assembly and test (OSAT). In some alternative embodiments, the redistribution structure 402 may be an organic substrate provided by the substrate supplier. The redistribution structure 402 includes a plurality of conductive elements 404 and a polymer substrate 406. Since polymer is a dielectric material, the polymer substrate 406 may be considered as a dielectric layer. The conductive elements 404 are embedded in the polymer substrate 406. The conductive elements 404 includes a plurality of first bonding pads 408, a plurality of second bonding pads 410, and a plurality of interconnect structures (not illustrated). The first bonding pads 408 are disposed at a first surface S1 of the redistribution structure 402 and are exposed by the polymer substrate 406. The second bonding pads 410 are disposed at a second surface S2 of the redistribution structure 402 opposite to the first surface S1 and are exposed by the polymer substrate 406. The interconnect structures (not illustrated) are embedded in the polymer substrate 406 and are electrically connected between at least part of the first bonding pads 408 and at least part of the second bonding pads 410.

Thereafter, the package structures 100 shown in FIG. 1G are coupled to or placed on the first surface S1 of the redistribution structure 402 through flip-chip bonding. The second conductive terminals 126 of the package structures 100 are electrically connected to the first bonding pads 408 of the redistribution structure 402. In other words, the second conductive terminals 126 are electrically connected between the redistribution layer 114 and the redistribution structure 402.

Figure 4B:
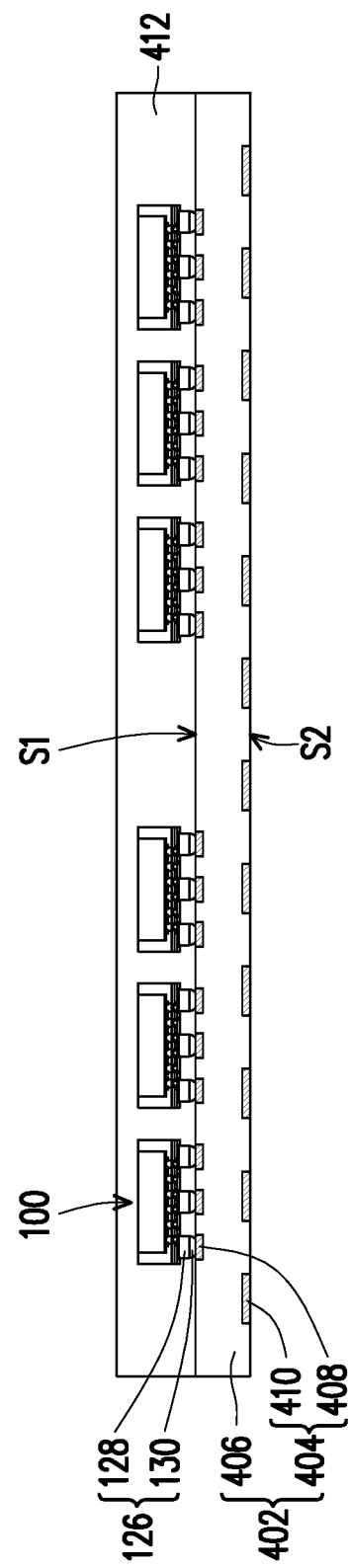

Referring to FIG. 4B through FIG. 4D, the steps are similar to the steps illustrated in FIG. 2C and FIG. 2E to FIG. 2F, so the detailed descriptions are omitted herein. A second encapsulant 412 is formed on the first surface S1 of the redistribution structure 402 to encapsulate the package structures 100. In the present embodiment, the step of coupling the redistribution structure 402 with the package structures 100 precedes the step of encapsulating the package structures 100 by the second encapsulant 412. A plurality of solder balls 414 are formed over the second surface S2 of the redistribution structure 402 to electrically connect with the second bonding pads 410 of the redistribution structure 402. The second encapsulant 412 is sawed between two adjacent package structures 100, so as to form a plurality of semiconductor package structures 400.

In the present embodiment, fan-out package structures (the package structures 100) are coupled to a conventionally available organic substrate for assembly (the redistribution structure 402), so as to form the semiconductor package structures 400. Thereby, each of the semiconductor package structures 400 may be regarded as a FCCSP-like or a FCBGA-like package structure with fan-out package structure therein. Since the package structures 100 are coupled to the conventionally available organic substrate for assembly, the fan-out technology is adapted to electrically connects the package structures 100 having smaller IC pad pitch (such as the fine pitch of the pad and the trace of the die 106) to an organic substrate having larger solder ball pitch (such as redistribution structure 402). Therefore, the IC pad pitch (fine pitch) in each of the package structures 100 may be reduced while still being compatible with the conventionally available organic substrate (such as the redistribution structure 402). In addition, the redistribution layer 114 is formed in the package structure 100, whereas the redistribution structure 402 is another pre-fabricated structure. In other words, the redistribution layer 114 and the redistribution structure 402 are formed separately during different fan-out processes. Therefore, a warpage level of the package structures 400 may be lowered. As a result, the semiconductor package structure 400 may incorporate redistribution structure 402 with a more complicated design.

Figure 5A:
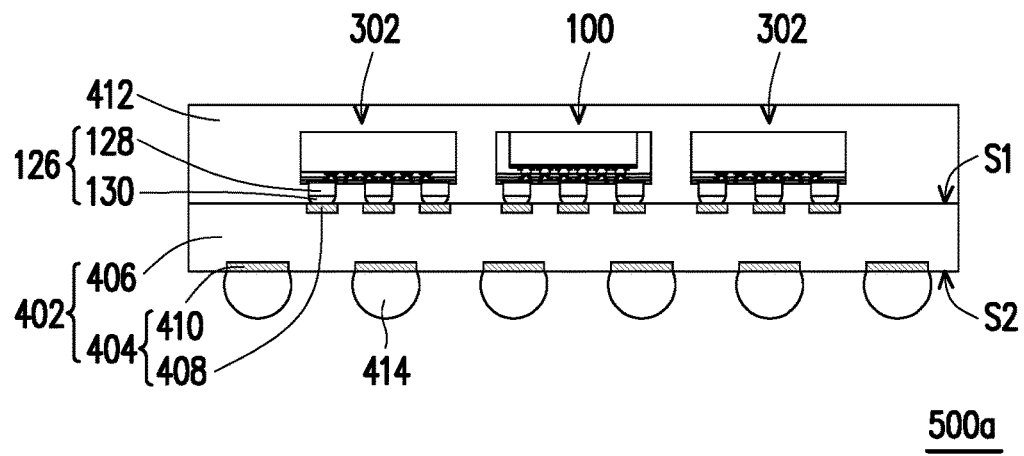
FIG. 5A to FIG. 5C are schematic cross-sectional views illustrating semiconductor package structures according to some embodiments of the present invention.
Figure 5B:
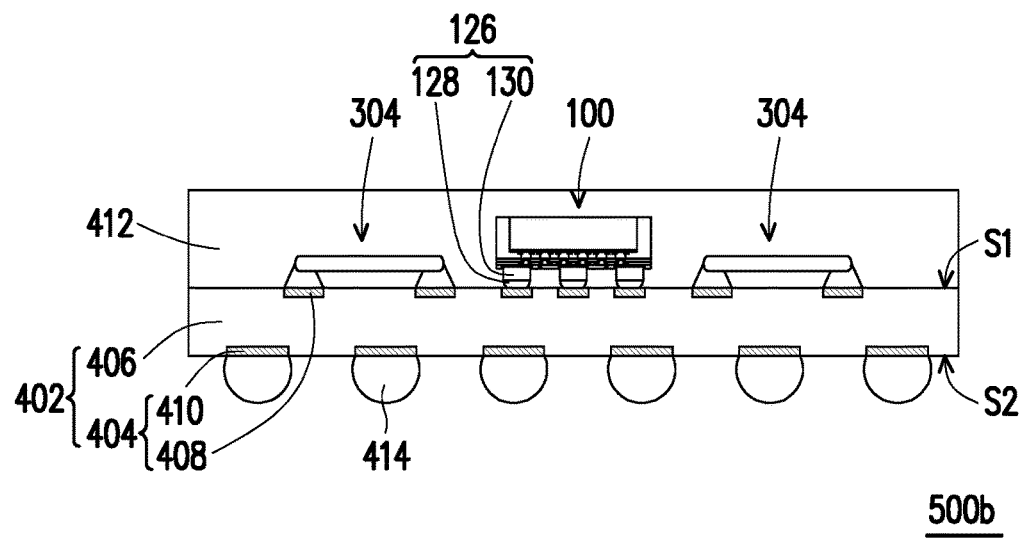
Figure 5C:
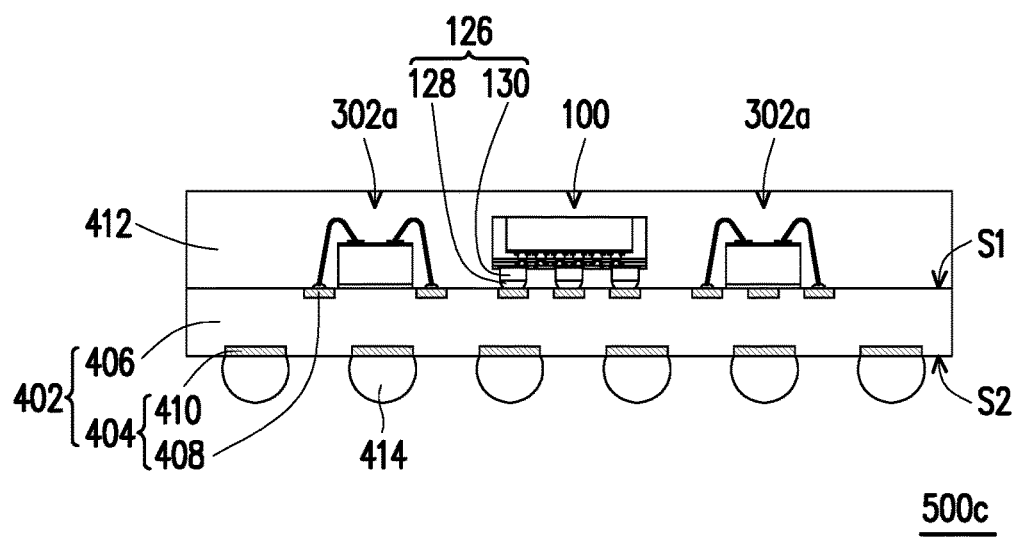

FIG. 5A to FIG. 5C are schematic cross-sectional views illustrating semiconductor package structures 500a, 500b, and 500c according to some embodiments of the present invention.

Referring to FIG. 5A, the semiconductor package structure 500a is similar to the semiconductor package structure 400 shown in FIG. 4D, so the detailed descriptions are omitted herein. The difference between the semiconductor package structure 500a and the semiconductor package structure 400 lies in that the semiconductor package structure 500a further includes at least one additional package structure 302. The additional package structure 302 in the present embodiment is similar to the additional package structure 302 discussed in the related descriptions of FIG. 3B, so the detailed descriptions are omitted herein. Similar to the package structures 100, the additional package structures 302 are also coupled to the first surface S1 of the redistribution structure 402 through flip-chip bonding. Subsequently, the steps illustrated FIG. 4B to FIG. 4D may be performed to obtain the semiconductor package structure 500a. As a result, package structures of different type can be readily integrated.

Referring to FIG. 5B, the semiconductor package structure 500b is similar to the semiconductor package structure 400 shown in FIG. 4D, so the detailed descriptions are omitted herein. The difference between the semiconductor package structure 500b and the semiconductor package structure 400 lies in that the semiconductor package structure 500b further includes at least one passive device 304. The passive device 304 in the present embodiment is similar to the passive device 304 discussed in the related descriptions of FIG. 3C, so the detailed descriptions are omitted herein. Similar to the package structures 100, the passive devices 304 are also placed or disposed on the first surface S1 of the redistribution structure 402. Subsequently, the steps illustrated FIG. 4B to FIG. 4D may be performed to obtain the semiconductor package structure 500b. As a result, package structures and passive devices can be readily integrated.

Referring to FIG. 5C, the semiconductor package structure 500c is similar to the semiconductor package structure 500a shown in FIG. 5A, so the detailed descriptions are omitted herein. The difference between the semiconductor package structure 500c and the semiconductor package structure 500a lies in that the additional package structure 302a are coupled to the first surface S1 of the redistribution structure 402 through wire bonding. Accordingly, during the formation of the additional package structure 302a, the steps related to the first encapsulant 112, the redistribution layer 114, and the second conductive terminals 126 illustrated in FIG. 1A to FIG. 1G may be omitted. Based on the configuration of the semiconductor package structure 500c, package structures of different type can be readily integrated.

FIG. 6A to FIG. 6F are schematic cross-sectional views illustrating a manufacturing method of semiconductor package structures 600 according to yet another embodiment of the present invention.

Figure 6A:
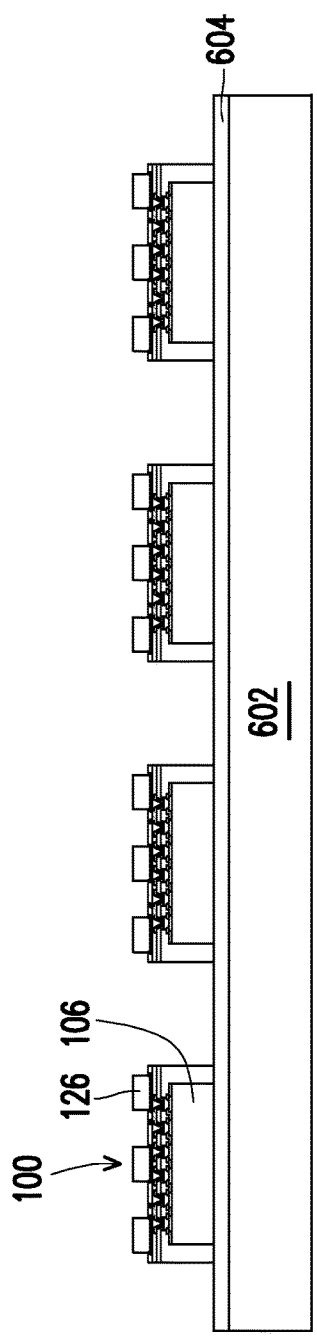

Referring to FIG. 6A, the package structures 100 shown in FIG. 1G are placed on a carrier 602 such that the active surface of the die 106 faces upward. In some embodiments, an adhesive layer 604 may be disposed between the carrier 602 and the package structure 100 to temporarily improve the adhesion between the package structures 100 and the carrier 602. As illustrated in FIG. 6A, the second conductive terminals 126 may take the form of conductive pillars.

Figure 6B:
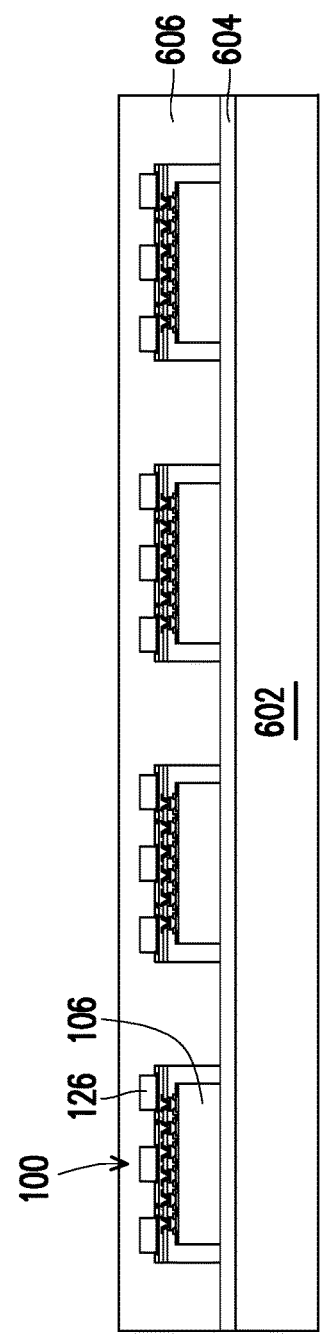

Referring to FIG. 6B, a second encapsulant 606 is formed on the carrier 602 to encapsulate the package structures 100. In some embodiments, the second encapsulant 606 may include molding compounds formed by a molding process. In some alternative embodiments, the second encapsulant 606 may be formed by an insulating material such as epoxy or other suitable resins.

Referring to FIG. 6C, a portion of the second encapsulant 606 is removed. In detail, the second encapsulant 606 is thinned until top surfaces of the second conductive terminals 126 of the package structure 100 are exposed. In some embodiments, after the second encapsulant 606 is thinned to expose top surfaces of the second conductive terminals 126, an etching process may be further performed on the second conductive terminals 126. For example, the second conductive terminals 126 may be partially removed such that top surfaces of the second conductive terminals 126 are slightly lower than a top surface of the second encapsulant 606. In some embodiments, the top surfaces of the second conductive terminals 126 are 1 μm to 3 μm lowered than the top surface of the second encapsulant 606. As a result, a surface roughness of the second encapsulant 606 and the second conductive terminals 126 may be enhanced, so as to increase an adhesive property with layers subsequently formed thereon. The thinning process may be achieved by, for example, mechanical grinding, Chemical-Mechanical Polishing (CMP), etching, or other suitable methods. The etching process for the second conductive terminals 126 may include anisotropic etching or isotropic etching.

Referring to FIG. 6D, a redistribution structure 608 is disposed on the package structures 100 and the second encapsulant 606. The redistribution structure 608 includes at least one dielectric layer 610 and a plurality of conductive elements 612 embedded in the dielectric layer 610. The conductive elements 612 include a plurality of first boding pads 614, a plurality of second bonding pads 616, and a plurality of interconnect structures 618. The first bonding pads 614 are disposed at a first surface S1 of the redistribution structure 608 facing the package structures 100. The bottommost dielectric layer 610 exposes the first bonding pads 614 such that the first bonding pads 614 are electrically connected to the second conductive terminals 126. In other words, the redistribution structure 608 is electrically connected to the second conductive terminals 126 of the package structure 100. The second bonding pads 616 are disposed at a second surface S2 of the redistribution structure 608 opposite to the first surface S1. The topmost dielectric layer 610 exposes the second bonding pads 616 for electrical connection with elements Ruined in the subsequent processes. The interconnect structures 618 are electrically connected between at least part of the first bonding pads 614 and at least part of the second bonding pads 616. Since the redistribution structure 608 is formed on both of the package structures 100 and the second encapsulant 606 instead of fully formed on the package structures 100, a warpage level of the package structures 100 may be reduced. In the present embodiment, the step of encapsulating the package structures 100 precedes the step of coupling the redistribution structure 608 with the package structures 100.

Figure 6E:
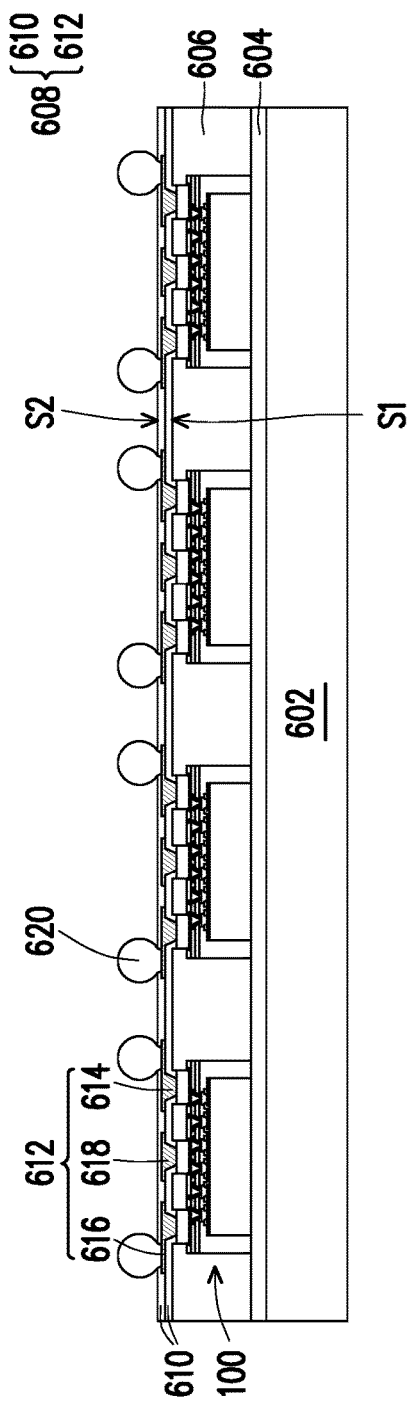

Referring to FIG. 6E, a plurality of solder balls 620 are formed over the second surface S2 of the redistribution structure 608. The solder balls 620 are electrically connected to the second bonding pads 616 of the redistribution structure 608. The solder balls 620 may be formed by, for example, a ball placement process.

Figure 6F:
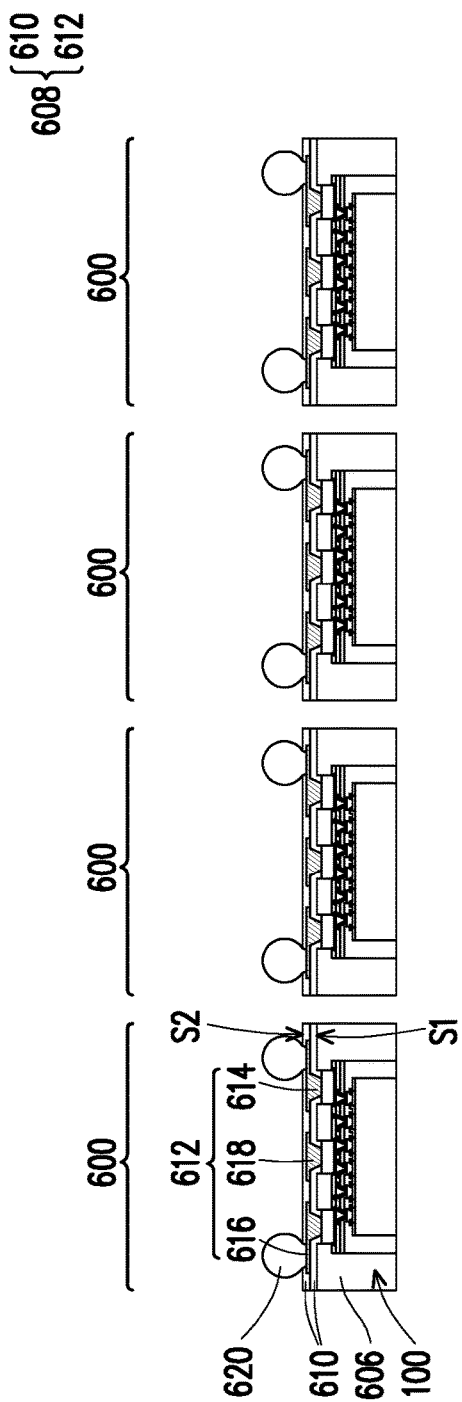

Referring to FIG. 6F, the carrier 602 and the adhesive layer 604 are removed or de-bonded from the package structures 100 and the second encapsulant 606. For example, thermal energy or optical energy (such as heating or UV irradiation) may be applied to the adhesive layer 604. Upon stimulation, the adhesive layer 604 loses adhesive property and may be readily peeled off from the carrier 602, the package structures 100, and the second encapsulant 606. It should be noted that FIG. 6E and FIG. 6F illustrated that the solder balls 620 are formed prior to the de-bonding process. However, it construes no limitation in the present invention. In some alternative embodiments, the de-bonding process may be performed before the solder balls 620 are formed on the second surface S2 of the redistribution structure 608. The second encapsulant 606 is sawed between adjacent package structures 100, so as to form a plurality of semiconductor package structures 600. The singulation process includes, for example, cutting with rotating blade or laser beam.

Each of the semiconductor package structures 600 forms a fan-out package structure having a fan-out package structure (package structure 100) embedded therein. The second encapsulant 606 of the semiconductor package structures 600 further provides extra area around each of the package structures 100 for trace routing. Therefore, even higher numbers of I/O connections may be achieved. In addition, a conventionally known through silicon via (TSV) interposer may be replaced by the redistribution structure 608 to reduce the manufacturing cost. Furthermore, since the redistribution structure 608 is formed on both of the package structures 100 and the second encapsulant 606 instead of fully formed on the package structures 100, a warpage level of the package structures 100 may be reduced. As a result, the semiconductor package structure 600 may incorporate redistribution structure 608 with a more complicated design.

Figure 7A:
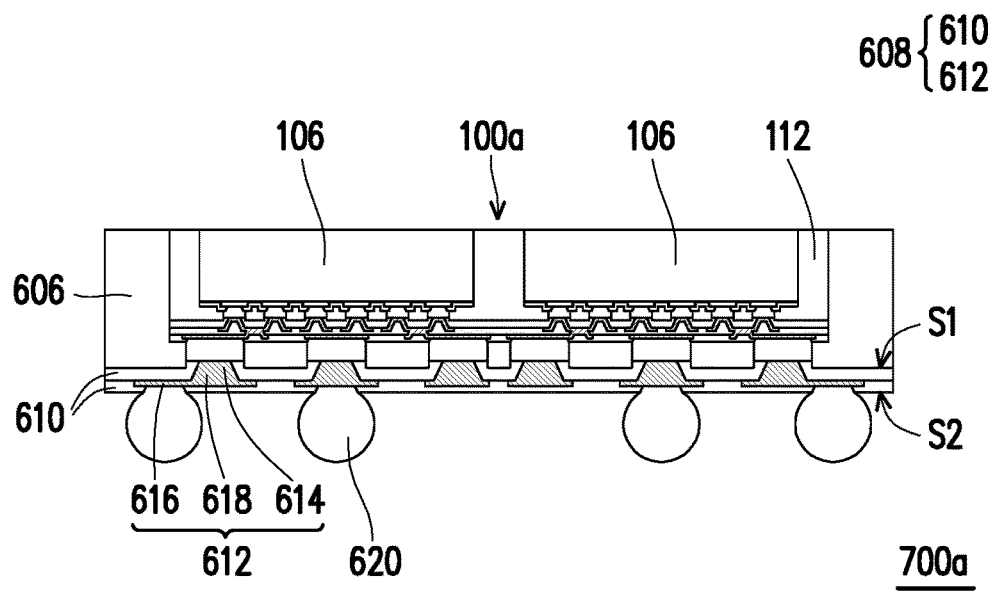
FIG. 7A to FIG. 7C are schematic cross-sectional views illustrating semiconductor package structures according to some embodiments of the present invention.
Figure 7B:
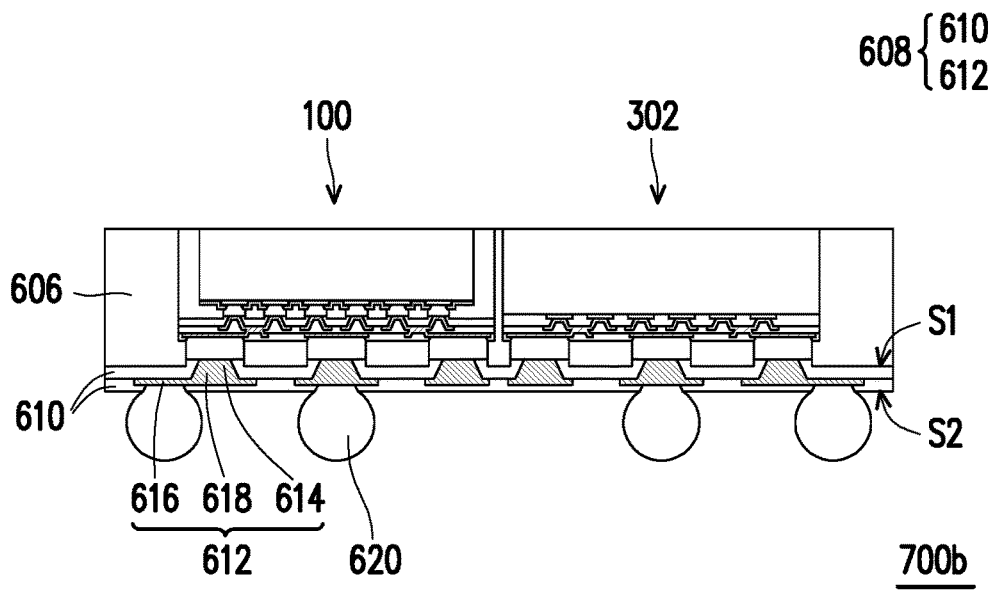
Figure 7C:
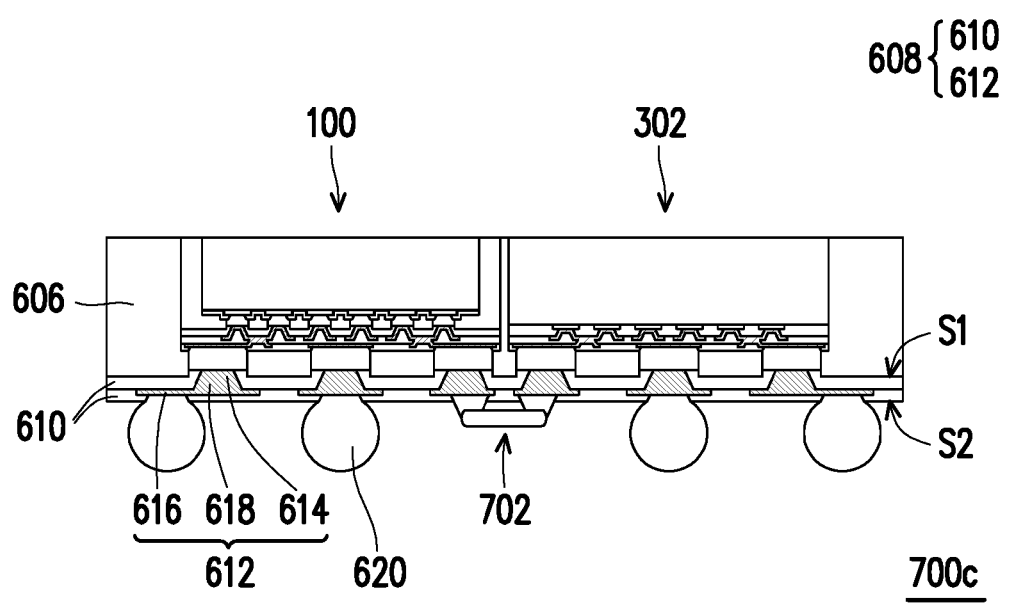

FIG. 7A to FIG. 7C are schematic cross-sectional views illustrating semiconductor package structures 700a, 700b, and 700c according to some embodiments of the present invention.

Referring to FIG. 7A, the semiconductor package structure 700a is similar to the semiconductor package structure 600 shown in FIG. 6F, so the detailed descriptions are omitted herein. The difference between the semiconductor package structure 700a and the semiconductor package structure 600 lies in that the semiconductor package structure 700a includes the package structure 100a. The package structure 100a in the present embodiment is similar to the package structure 100a discussed in the related descriptions of FIG. 3A, so the detailed descriptions are omitted herein. Therefore, multiple dies may be integrated in the package structure 100a.

Referring to FIG. 7B, the semiconductor package structure 700b is similar to the semiconductor package structure 600 shown in FIG. 6F, so the detailed descriptions are omitted herein. The difference between the semiconductor package structure 700b and the semiconductor package structure 600 lies in that the semiconductor package structure 700b further includes at least one additional package structure 302. The additional package structure 302 in the present embodiment is similar to the additional package structure 302 discussed in the related descriptions of FIG. 3B, so the detailed descriptions are omitted herein. Similar to the package structures 100, the additional package structure 302 is placed on the carrier 602. Subsequently, the steps illustrated FIG. 6B to FIG. 6F may be performed to obtain the semiconductor package structure 700b. As a result, package structures of different type can be readily integrated, so as to meet applications of multi-chip package (MCP) or system in package (SIP).

Referring to FIG. 7C, the semiconductor package structure 700c is similar to the semiconductor package structure 700b shown in FIG. 7B, so the detailed descriptions are omitted herein. The difference between the semiconductor package structure 700c and the semiconductor package structure 700b lies in that the semiconductor package structure 700c further includes at least one passive device 702 disposed over the second surface S2 of the redistribution structure 608. The passive device 702 in the present embodiment is similar to the passive device 304 in FIG. 3C. The passive device 702 is electrically connected to the second bonding pads 616 of the redistribution structure 608. As a result, package structures and passive devices can be readily integrated.

Based on the foregoing, the first encapsulant of the package structure provides additional area around each die such that the first conductive terminals on the die may be routed to the additional area via the redistribution layer. Based on the fan-out configuration of the package structure, the package structure is compatible with higher I/O connection numbers. In addition, improved electrical and thermal performance of the package structure may be attained. Similarly, as a result of embedding the package structure in the second encapsulant and coupling the redistribution structure with the second conductive terminals of the package structure, the semiconductor package structure forms another fan-out package structure. Therefore, even higher numbers of I/O connection may be achieved. In addition, a conventionally known through silicon via (TSV) interposer may be replaced by the redistribution structure to reduce the manufacturing cost. Furthermore, the redistribution layer and the redistribution structure are formed separately during different fan-out processes. Therefore, a warpage level of the package structures may be lowered. As a result, the semiconductor package structure may incorporate redistribution structure with a more complicated design.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a semiconductor package structure, comprising:
    forming at least one package structure, wherein the at least one package structure comprises at least one die having a plurality of first conductive terminals thereon, a first encapsulant encapsulating the at least one die and exposing at least part of the first conductive terminals, a redistribution layer over the first encapsulant and electrically connected to the first conductive terminals, and a plurality of second conductive terminals over the redistribution layer;
    coupling the at least one package structure to a first surface of a redistribution structure, wherein the redistribution structure further has a second surface opposite to the first surface, and the second conductive terminals of the at least one package structure are electrically connected to between the redistribution layer and the redistribution structure; and
    encapsulating the at least one package structure by a second encapsulant, wherein the second encapsulant exposes at least part of the second conductive terminals.

2. The manufacturing method of a semiconductor package structure according to claim 1, wherein each of the second conductive terminals comprises a conductive pillar, a conductive bump, or a combination thereof.

3. The manufacturing method of a semiconductor package structure according to claim 1, further comprising forming a plurality of solder balls over the second surface of the redistribution structure opposite to the first surface.

4. The manufacturing method of a semiconductor package structure according to claim 3, wherein a first pitch between two adjacent first conductive terminals is smaller than a second pitch between two adjacent second conductive terminals, and the second pitch is smaller than a third pitch between two adjacent solder balls.

5. The manufacturing method of a semiconductor package structure according to claim 3, further comprising forming at least one passive device on the second surface of the redistribution structure.

6. The manufacturing method of a semiconductor package structure according to claim 1, further comprising:
coupling at least one additional package structure or at least one passive device to the first surface of the redistribution structure; and
encapsulating the at least one additional package structure or the at least one passive device by the second encapsulant.

7. The manufacturing method of a semiconductor package structure according to claim 1, wherein the step of coupling the redistribution structure with the at least one package structure precedes the step of encapsulating the at least one package structure.

8. The manufacturing method of a semiconductor package structure according to claim 7, wherein the step of coupling the redistribution structure with the at least one package structure and the step of encapsulating the at least one package structure comprises:
forming the redistribution structure on a carrier, wherein the redistribution structure comprises at least one dielectric layer and a plurality of conductive elements embedded in the dielectric layer, and the dielectric layer exposes at least part of the conductive elements;
placing the at least one package structure over the first surface of the redistribution structure, wherein the second conductive terminals are electrically connected with the conductive elements;
forming the second encapsulant on the first surface of the redistribution structure; and
removing the carrier from the redistribution structure.

9. The manufacturing method of a semiconductor package structure according to claim 7, wherein the step of coupling the redistribution structure with the at least one package structure and the step of encapsulating the at least one package structure comprises:
providing the redistribution structure, wherein the redistribution structure comprises at least one dielectric layer and a plurality of conductive elements embedded in the dielectric layer, and the dielectric layer exposes at least part of the conductive elements;
placing the at least one package structure over the first surface of the redistribution structure, wherein the second conductive terminals are electrically connected with the conductive elements; and
forming the second encapsulant on the first surface of the redistribution structure.

10. The manufacturing method of a semiconductor package structure according to claim 1, wherein the step of encapsulating the at least one package structure precedes the step of coupling the redistribution structure with the at least one package structure.

11. The manufacturing method of a semiconductor package structure according to claim 10, wherein the step of encapsulating the at least one package structure and the step of coupling the redistribution structure with the at least one package structure comprises:
providing a carrier;
placing the at least one package structure on the carrier;
encapsulating the at least one package structure by the second encapsulant;
removing at least part of the second encapsulant to expose at least part of the second conductive terminals;
forming the redistribution structure over the second encapsulant to electrically connect with the second conductive terminals; and
removing the carrier from the at least one package structure and the second encapsulant.

* * * * *